US012426433B2

(12) United States Patent
Fusella et al.

(10) Patent No.: US 12,426,433 B2
(45) Date of Patent: Sep. 23, 2025

(54) APPLICATION OF NANOPARTICLES FOR PLASMON ENERGY EXTRACTION IN ORGANIC DEVICES

(71) Applicant: Universal Display Corporation, Ewing, NJ (US)

(72) Inventors: Michael Fusella, Lawrenceville, NJ (US); Nicholas J. Thompson, New Hope, PA (US); David E. Paller, Lambertville, NJ (US); Renata Saramak, Lambertville, NJ (US)

(73) Assignee: Universal Display Corporation, Ewing, NJ (US)

( * ) Notice: Subject to any disclaimer, the term of this patent is extended or adjusted under 35 U.S.C. 154(b) by 601 days.

(21) Appl. No.: 17/484,217

(22) Filed: Sep. 24, 2021

(65) Prior Publication Data
US 2022/0109105 A1 Apr. 7, 2022

Related U.S. Application Data

(60) Provisional application No. 63/086,836, filed on Oct. 2, 2020.

(51) Int. Cl.
*H10K 30/80* (2023.01)
*H10K 50/13* (2023.01)
*H10K 71/13* (2023.01)
*B82Y 20/00* (2011.01)
(Continued)

(52) U.S. Cl.
CPC ......... *H10K 30/865* (2023.02); *H10K 50/131* (2023.02); *H10K 71/135* (2023.02); *B82Y 20/00* (2013.01); *B82Y 40/00* (2013.01); *H10K 50/115* (2023.02)

(58) Field of Classification Search
CPC ...... H10K 10/20; H10K 50/11; H10K 50/115; H10K 50/125; H10K 50/131; H10K 50/805; H10K 50/81; H10K 50/82; H10K 59/30; H10K 59/35; H10K 71/135; H10K 30/865; B82Y 20/00; B82Y 40/00
See application file for complete search history.

(56) References Cited

U.S. PATENT DOCUMENTS

| 4,769,292 A | 9/1988 | Tang |
| 5,247,190 A | 9/1993 | Friend |
| 5,703,436 A | 12/1997 | Forrest |

(Continued)

FOREIGN PATENT DOCUMENTS

| CA | 3061524 A1 * | 5/2020 | ............. G01J 5/023 |
| CN | 107230747 A | 10/2017 | |

(Continued)

OTHER PUBLICATIONS

Oulachgar (Year: 2020).*

(Continued)

*Primary Examiner* — Eduardo A Rodela
(74) *Attorney, Agent, or Firm* — Butzel Long

(57) ABSTRACT

Techniques are provided for depositing a monolayer of nanoparticles over an OLED or comparable device. In combination with an enhancement layer disposed within a threshold distance of an emissive layer of the OLED, the nanoparticles may be used to provide a nanopatch antenna or otherwise improve the performance of the OLED.

20 Claims, 15 Drawing Sheets

(51) Int. Cl.
    *B82Y 40/00* (2011.01)
    *H10K 50/115* (2023.01)

(56) References Cited

U.S. PATENT DOCUMENTS

| | | | |
|---|---|---|---|
| 5,707,745 | A | 1/1998 | Forrest |
| 5,834,893 | A | 11/1998 | Bulovic |
| 5,844,363 | A | 12/1998 | Gu |
| 6,013,982 | A | 1/2000 | Thompson |
| 6,087,196 | A | 7/2000 | Sturm |
| 6,091,195 | A | 7/2000 | Forrest |
| 6,097,147 | A | 8/2000 | Baldo |
| 6,294,398 | B1 | 9/2001 | Kim |
| 6,303,238 | B1 | 10/2001 | Thompson |
| 6,337,102 | B1 | 1/2002 | Forrest |
| 6,468,819 | B1 | 10/2002 | Kim |
| 7,279,704 | B2 | 10/2007 | Walters |
| 7,431,968 | B1 | 10/2008 | Shtein |
| 7,629,017 | B2* | 12/2009 | Kodas .................. H05K 3/105 427/256 |
| 7,968,146 | B2 | 6/2011 | Wagner |
| 8,330,365 | B2* | 12/2012 | Kim ........................ H01J 9/02 445/24 |
| 9,647,220 | B2* | 5/2017 | Yoshinaga ........... C07D 493/04 |
| 9,691,828 | B2* | 6/2017 | Jiao ..................... H10K 59/877 |
| 9,853,220 | B2* | 12/2017 | Ma ...................... H10K 85/657 |
| 9,893,318 | B2 | 2/2018 | Dai |
| 9,960,386 | B2* | 5/2018 | Thompson ........... H10K 50/131 |
| 10,355,248 | B2 | 7/2019 | Zhang |
| 10,388,914 | B2* | 8/2019 | Zheng .................. H10K 50/18 |
| 10,505,158 | B2 | 12/2019 | Zhang |
| 10,593,902 | B2* | 3/2020 | Dong ..................... H01L 33/18 |
| 10,741,795 | B2* | 8/2020 | Huang .................. H10K 50/85 |
| 11,056,540 | B2 | 7/2021 | Thompson |
| 11,130,876 | B2* | 9/2021 | Rudisill ................. C09D 11/40 |
| 11,637,261 | B2* | 4/2023 | Fusella ................. H10K 50/12 257/13 |
| 2003/0230980 | A1 | 12/2003 | Forrest |
| 2004/0174116 | A1 | 9/2004 | Lu |
| 2009/0167162 | A1* | 7/2009 | Lin ........................ C07F 5/027 548/440 |
| 2010/0265307 | A1 | 10/2010 | Linton |
| 2012/0121800 | A1 | 5/2012 | Kim |
| 2015/0041780 | A1* | 2/2015 | Ma ....................... H10K 85/633 257/40 |
| 2017/0229663 | A1 | 8/2017 | Tsai |
| 2018/0053911 | A1* | 2/2018 | Yoshida ............... H10K 50/813 |
| 2020/0176700 | A1 | 6/2020 | Fusella |
| 2020/0176714 | A1 | 6/2020 | Fusella |
| 2020/0282659 | A1* | 9/2020 | Lan ....................... B29C 64/245 |
| 2020/0295093 | A1 | 9/2020 | Thompson |
| 2020/0295288 | A1 | 9/2020 | Fusella |
| 2020/0295291 | A1 | 9/2020 | Fusella |
| 2020/0295293 | A1 | 9/2020 | Menon |
| 2020/0295307 | A1 | 9/2020 | Fusella |
| 2021/0249633 | A1 | 8/2021 | Fusella |
| 2021/0265584 | A1 | 8/2021 | Fusella |
| 2022/0165802 | A1* | 5/2022 | Lee ........................ H10K 59/38 |

FOREIGN PATENT DOCUMENTS

| | | |
|---|---|---|
| CN | 107611287 | 1/2018 |
| CN | 110088930 | 8/2019 |
| CN | 111697157 A | 9/2020 |
| KR | 20100025002 | 3/2010 |
| KR | 20160001679 | 1/2016 |
| KR | 20200110225 | 9/2020 |
| WO | 2008057394 A1 | 5/2008 |
| WO | 2010011390 A2 | 1/2010 |

OTHER PUBLICATIONS

Baldo et al. "Highly efficient phosphorescent emission from organic electroluminescent devices", Nature, vol. 395, pp. 151-154, 1998.

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

Thomas Eiselt et al, "Inkjet-printed internal light extraction layers for organic light emitting Diodes", 2018 Flex. Print. Electron. 3 015007.

Korean Office Action (with English language translation) for Application No. 10-2021-0130902 dated Nov. 29, 2024.

Yersin et al., "The triplet state of organo-transition metal compounds. Triplet harvesting and singlet harvesting for efficient OLEDs", Coordination Chemistry Reviews 255 (2011), pp. 2622-2652.

Fusella et al., "Plasmonic enhancement of stability and brightness in organic light-emitting devices", Nature, vol. 585, Sep. 17, 2020, pp. 379-387.

* cited by examiner a) 75 nm Ag cubes, 5 mg/ml, 1 print pass b) 75 nm Ag cubes, 5 mg/ml, 2 print passes

APPLICATION OF NANOPARTICLES FOR PLASMON ENERGY EXTRACTION IN ORGANIC DEVICES

CROSS-REFERENCE TO RELATED APPLICATIONS

This application claims the benefit of U.S. Provisional Patent Application Ser. No. 63/086,836, filed Oct. 2, 2020, the entire contents of which are incorporated herein by reference.

FIELD

The present invention relates to devices and techniques for fabricating organic emissive devices, such as organic light emitting diodes, which include and make use of an arrangement of nanoparticles such as a nanopatch antenna, and devices and techniques including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
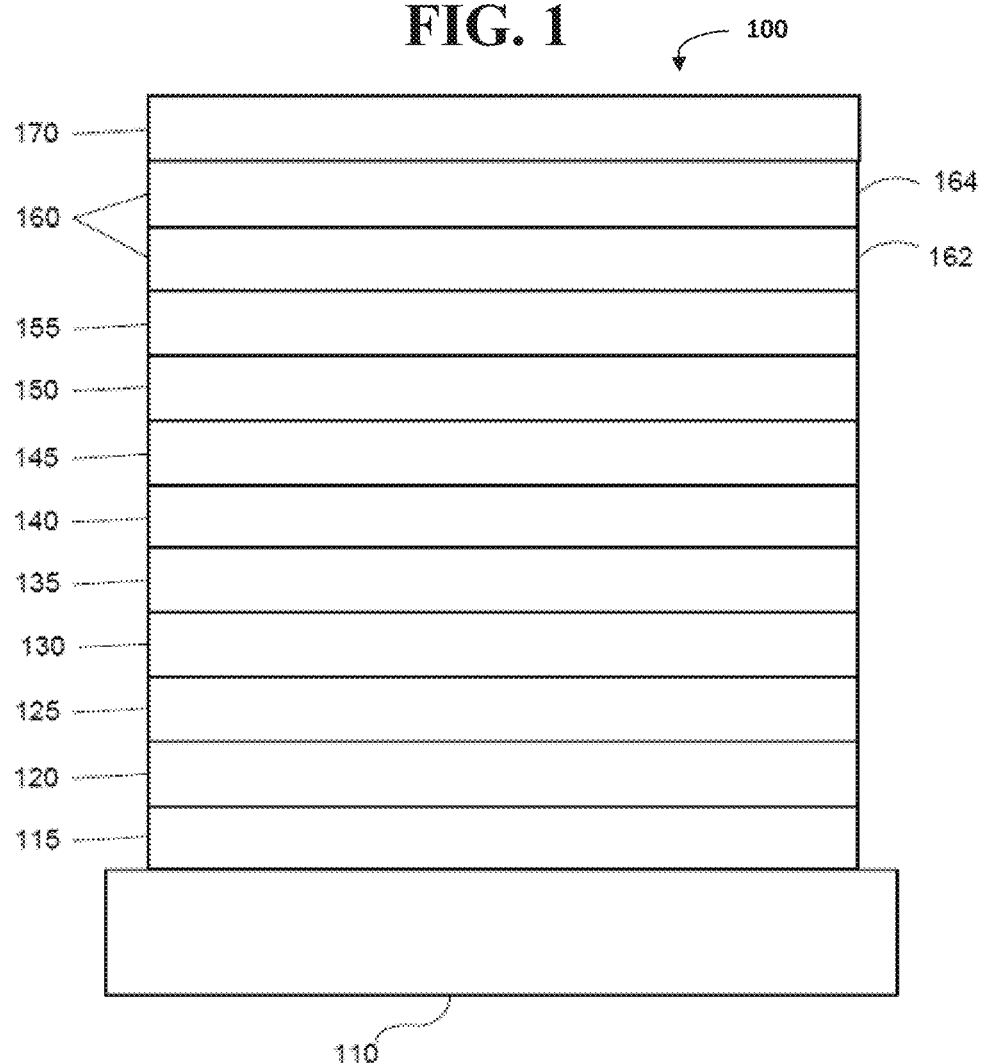
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
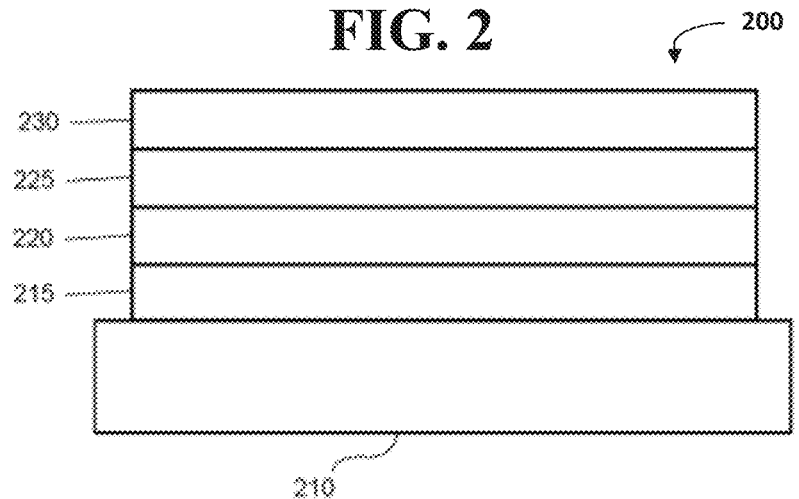
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order.

Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In some embodiments disclosed herein, emissive layers or materials, such as emissive layer 135 and emissive layer 220 shown in FIGS. 1-2, respectively, may include quantum dots. An "emissive layer" or "emissive material" as disclosed herein may include an organic emissive material and/or an emissive material that contains quantum dots or equivalent structures, unless indicated to the contrary explicitly or by context according to the understanding of one of skill in the art. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light, which may be altered by another layer such as a color filter or other color altering layer that does not itself emit an initial light within the device, but may re-emit altered light of a different spectra content based upon initial light emitted by the emissive layer.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

In some embodiments, at least one of the anode, the cathode, or a new layer disposed over the organic emissive layer functions as an enhancement layer. The enhancement layer comprises a plasmonic material exhibiting surface plasmon resonance that non-radiatively couples to the emitter material and transfers excited state energy from the emitter material to non-radiative mode of surface plasmon polariton. The enhancement layer is provided no more than a threshold distance away from the organic emissive layer, wherein the emitter material has a total non-radiative decay rate constant and a total radiative decay rate constant due to the presence of the enhancement layer and the threshold distance is where the total non-radiative decay rate constant is equal to the total radiative decay rate constant. In some embodiments, the OLED further comprises an outcoupling layer. In some embodiments, the outcoupling layer is disposed over the enhancement layer on the opposite side of the organic emissive layer. In some embodiments, the outcoupling layer is disposed on opposite side of the emissive layer from the enhancement layer but still outcouples energy from the surface plasmon mode of the enhancement layer. The outcoupling layer scatters the energy from the surface plasmon polaritons. In some embodiments this energy is scattered as photons to free space. In other embodiments, the energy is scattered from the surface plasmon mode into other modes of the device such as but not limited to the organic waveguide mode, the substrate mode, or another waveguiding mode. If energy is scattered to the non-free space mode of the OLED other outcoupling schemes could be incorporated to extract that energy to free space. In some embodiments, one or more intervening layer can be disposed between the enhancement layer and the outcoupling layer. The examples for intervening layer(s) can be dielectric materials, including organic, inorganic, perovskites, oxides, and may include stacks and/or mixtures of these materials.

The enhancement layer modifies the effective properties of the medium in which the emitter material resides resulting in any or all of the following: a decreased rate of emission, a modification of emission line-shape, a change in emission intensity with angle, a change in the stability of the emitter material, a change in the efficiency of the OLED, and reduced efficiency roll-off of the OLED device. Placement of the enhancement layer on the cathode side, anode side, or on both sides results in OLED devices which take advantage of any of the above-mentioned effects. In addition to the specific functional layers mentioned herein and illustrated in the various OLED examples shown in the figures, the OLEDs according to the present disclosure may include any of the other functional layers often found in OLEDs.

The enhancement layer can be comprised of plasmonic materials, optically active metamaterials, or hyperbolic metamaterials. As used herein, a plasmonic material is a material in which the real part of the dielectric constant crosses zero in the visible or ultraviolet region of the electromagnetic spectrum. In some embodiments, the plasmonic material includes at least one metal. In such embodiments the metal may include at least one of Ag, Al, Au, Ir, Pt, Ni, Cu, W, Ta, Fe, Cr, Mg, Ga, Rh, Ti, Ru, Pd, In, Bi, Ca alloys or mixtures of these materials, and stacks of these materials. In general, a metamaterial is a medium composed of different materials where the medium as a whole acts differently than the sum of its material parts. In particular, we define optically active metamaterials as materials which have both negative permittivity and negative permeability. Hyperbolic metamaterials, on the other hand, are anisotropic media in which the permittivity or permeability are of different sign for different spatial directions. Optically active metamaterials and hyperbolic metamaterials are strictly distinguished from many other photonic structures such as Distributed Bragg Reflectors ("DBRs") in that the medium should appear uniform in the direction of propagation on the length scale of the wavelength of light. Using terminology that one skilled in the art can understand: the dielectric constant of the metamaterials in the direction of propagation can be described with the effective medium approximation. Plasmonic materials and metamaterials provide methods for controlling the propagation of light that can enhance OLED performance in a number of ways.

In some embodiments, the enhancement layer is provided as a planar layer. In other embodiments, the enhancement layer has wavelength-sized features that are arranged periodically, quasi-periodically, or randomly, or sub-wavelength-sized features that are arranged periodically, quasi-periodically, or randomly. In some embodiments, the wavelength-sized features and the sub-wavelength-sized features have sharp edges.

In some embodiments, the outcoupling layer has wavelength-sized features that are arranged periodically, quasi-periodically, or randomly, or sub-wavelength-sized features that are arranged periodically, quasi-periodically, or randomly. In some embodiments, the outcoupling layer may be composed of a plurality of nanoparticles and in other embodiments the outcoupling layer is composed of a plurality of nanoparticles disposed over a material. In these embodiments the outcoupling may be tunable by at least one of varying a size of the plurality of nanoparticles, varying a shape of the plurality of nanoparticles, changing a material of the plurality of nanoparticles, adjusting a thickness of the material, changing the refractive index of the material or an additional layer disposed on the plurality of nanoparticles, varying a thickness of the enhancement layer, and/or varying the material of the enhancement layer. The plurality of nanoparticles of the device may be formed from at least one of metal, dielectric material, semiconductor materials, an alloy of metal, a mixture of dielectric materials, a stack or layering of one or more materials, and/or a core of one type of material and that is coated with a shell of a different type of material. In some embodiments, the outcoupling layer is composed of at least metal nanoparticles wherein the metal is selected from the group consisting of Ag, Al, Au, Ir, Pt, Ni, Cu, W, Ta, Fe, Cr, Mg, Ga, Rh, Ti, Ru, Pd, In, Bi, Ca, alloys or mixtures of these materials, and stacks of these materials. The plurality of nanoparticles may have additional layer disposed over them. In some embodiments, the polarization of the emission can be tuned using the outcoupling layer. Varying the dimensionality and periodicity of the outcoupling layer can select a type of polarization that is preferentially outcoupled to air. In some embodiments the outcoupling layer also acts as an electrode of the device.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the thermal population between the triplet states and the singlet excited states. Compounds that are capable of generating E-type delayed fluorescence are required to have very small singlet-triplet gaps. Thermal energy can activate the transition from the triplet state back to the singlet state. This type of delayed fluorescence is also known as thermally activated delayed fluorescence (TADF). A distinctive feature of TADF is that the delayed component increases as temperature rises due to the increased thermal energy. If the reverse intersystem crossing rate is fast enough to minimize the non-radiative decay from the triplet state, the fraction of back populated singlet excited states can potentially reach 75%. The total singlet fraction can be 100%, far exceeding the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap (AES-T). Organic, non-metal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small AES-T. These states may involve CT states. Often, donor-acceptor luminescent materials are constructed by connecting an electron donor moiety such as amino- or carbazole-derivatives and an electron acceptor moiety such as N-containing six-membered aromatic ring.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

As previously noted, nanoparticle-based nanopatch antennas (NPAs), which include a planar metal topped by a dielectric gap material and covered with nanoparticles, have been found effective at outcoupling energy in the form of light from the surface plasmon (SP) mode in an OLED where the emissive layer is within a threshold distance of the enhancement layer. This "threshold distance" is defined as the distance at which the total non-radiative decay rate constant is equal to the total radiative decay rate constant, as described in further detail in U.S. Pat. No. 9,960,386, which is incorporated by reference in its entirety for all purposes.

Outcoupling light from the surface plasmon mode is desirable because the enhancement layer stabilizes the device but results in a dimmer device. The combination of the enhancement layer and nanoparticle based outcoupling technique allows for obtaining OLEDs that live longer at display brightness, for example as described in further detail in U.S. Patent Application Publication Nos. 2020/0295288, 2021/0265584, and 2021/0249633, each of which is incorporated by reference in its entirety for all purposes. The present disclosure provides techniques for deposit nanoparticles using inkjet printing and other techniques, which provide several advantages over conventional deposition techniques such as spin coating or drop casting. Embodiments disclosed herein allow for realization of an enhancement layer in combination with nanoparticle-based outcoupling at levels sufficiently scalable for mass production.

While prior work techniques have used inkjet printing for depositing metal nanoparticles in high-density stacked layers to form metal contacts, embodiments disclosed herein achieve a monolayer of reasonably un-agglomerated nanoparticles, which allows for efficient nanoparticle-based outcoupling of the plasmon energy as light. Conventionally, spin coating would be used to achieve these and similar desired films. However, as disclosed herein, controlled inkjet printing provides many advantages when compared to such conventional methods. For example, print deposition settings have been tailored as disclosed herein to achieve uniform, near-monolayer nanoparticle films that, when incorporated into devices, demonstrate comparable external quantum efficiencies (EQE) to spin cast films, as shown in Table 1 below.

TABLE 1

External quantum efficiency (EQE) data measured from the nanoparticle plasmon extraction side of various OLEDs utilizing the structures disclosed herein. The nanoparticles are deposited via: (a) inkjet printing, (b) paint brush, (c) air brush. All data plots are normalized to a spin cast control sample on an identically structured OLED.

| Application method | EQE @ 10 mA/cm$^2$ (normalized) |
|---|---|
| Inkjet printed | 0.91 |
| Paint brush | 0.98 |
| Air brush | 0.86 |
| Spin cast | 1.00 |

For example, as disclosed in further detail herein, these settings may include, but may not be limited to the following parameters. Dispersing 50-100 nm nanoparticles in a non-viscous, volatile solvent (most preferably, ethanol, propanol, or combinations thereof with water or other solvents) at a mass density of 1-10 mg/mL, more preferably 2-7 mg/mL for Ag nanoparticles. The nanoparticle size range may be chosen, for example, based upon the size of nanoparticles that provide the best outcoupling of visible light when incorporated into the plasmon outcoupling scheme disclosed herein, and with good efficiency. Using particles outside this range may cause problems in some embodiments, such as aggregation of the particles in solution, which may hamper the ability to form a monolayer film, and/or increased likelihood of clogging the inkjet nozzle. However, other embodiments may use nanoparticles having different sizes or ranges of sizes, as disclosed herein. The mass density of nanoparticles in the solution also may be selected to maintain a desirable balance between nanoparticle density, and a uniform monolayer in the resulting print. A mass density range resulting from the nanoparticle sizes disclosed herein has been found to be most successful at achieving a monolayer of un-agglomerated particles. In general, a lower concentration typically results in more dispersed nanoparticles, which may result in the nanoparticles being too dispersed for efficient plasmon outcoupling. Higher concentrations typically result in a higher chance of nanoparticle aggregation and stacking, which in turn shades the output of the OLED and prevents efficient conversion of plasmon energy to light. At even higher mass concentrations, the solution may become too viscous to print or may make clogging the printhead nozzle more likely.

Selection of the volatile solvent composition also may be important because it can directly affect the resolution of the resulting print. Generally it is undesirable to use a solvent that evaporates too slowly, since the resulting process is similar to drop casting the solution on the surface, thereby essentially eliminating the print resolution. This is also likely to result in a higher occurrence of nanoparticle aggregation and stacking, particularly at the points where the print "dots" deposited on the substrate flow together. Using a more quickly-drying solvent typically increases print resolution and prevents dots from flowing into each other (resulting in aggregation/stacking); this is also why in some embodiments it is desirable to use an elevated platen temperature as disclosed herein, to encourage solvent evaporation. However, drying too quickly also may be undesirable because the nanoparticles should disperse uniformly across the surface before the drying is complete to avoid clumping. Examples of solvents disclosed herein have been found to have a drying rate that is sufficiently fast to maintain the desired print resolution and prevent stacking and clumping, while still resulting in uniform dispersion of nanoparticles across the surface. In some embodiments, multiple solvents may be used. The relative concentration of solvents may be selected to achieve a desired drying rate and therefore a desired concentration and/or arrangement of nanoparticles within the monolayer. For example, water and ethanol are miscible, but water dries much more slowly than ethanol. So, to reduce the drying rate of an ethanol solution used in accordance with embodiments disclosed herein, a fraction of water may be added to the solvent, such as 20-80%. Using different proportions of water allows for very fine control over the drying time of the print droplets. Much like the platen temperature, the relative mix of solvents or, specifically, the relative water content, may directly affect the resolution of the print and the likelihood of the print droplets running together. As such, adjusting the contents of the solvent allows for further reduction in nanoparticle aggregation and stacking at the boundary of two droplets running together.

It may be preferred for the solvent to be pure and not contain additional materials, such as stabilizing polymers commonly added to colloidal nanoparticle solutions. In some embodiments, the material ejected from the inkjet nozzle may be filtered to remove such polymers or other unwanted material.

Optimizing the drop spacing and drop size to achieve even coverage. For example, in some cases it is preferred for the ratio of drop size to drop spacing to be between 1:1 and 3:1, more preferably between 1:1 and 2:1.

The printhead speed may be selected between 10-100 mm/sec, or 100-2000 drops/sec, more preferably 250-1000 drops/sec.

Figure 14A:
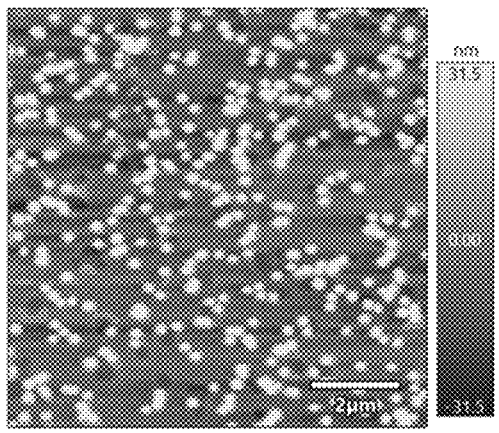
FIGS. 14A and 14B show atomic force microscope image of an inkjet-printed nanoparticle film as disclosed herein, printed in the same location one or two times, respectively.
Figure 14B:
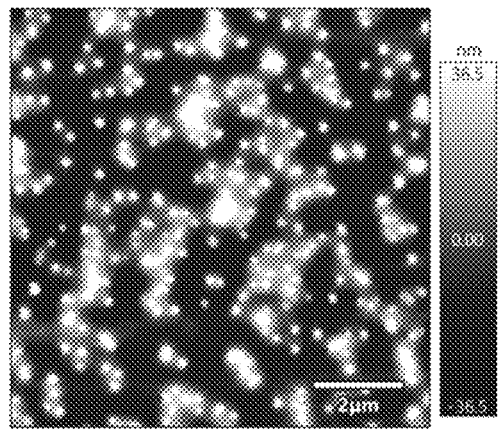

Multiple print cycles or passes may be used, preferably 1-10, to achieve sufficient nanoparticle density while avoiding significant aggregation and/or stacking. For example, FIG. 14A shows an atomic force microscope image of an inkjet-printed nanoparticle film as disclosed herein, printed in one pass. FIG. 14B shows the same film after a second pass is printed on top of the first pass. The single pass in FIG. 14A shows very little nanoparticle stacking and aggregation, resulting in a monolayer that is desirable for NPA plasmon outcoupling. In FIG. 14B, more nanoparticle stacking and aggregation can be observed, which generally is undesirable for NPA plasmon outcoupling, but may be desirable for other applications such as incorporating the nanoparticle scattering into a diffuser or similar structure on the device.

The platen on which the substrate is held during deposition may be maintained above ambient temperature to evaporate the solvent more quickly and prevent unwanted flow of droplets into each other. For example, the platen temperature may be maintained between 20 C and 100 C, more preferably between 30 and 60 C during operation of the inkjet nozzle to deposit nanoparticles over the OLED arranged on the substrate. As previously disclosed, it may be desirable to maintain the platen (and accordingly the substrate and OLED layers disposed over the substrate) at these elevated temperatures to encourage the desired evaporation rate of the solvent in which the nanoparticles are dispersed during printing.

Figure 3:
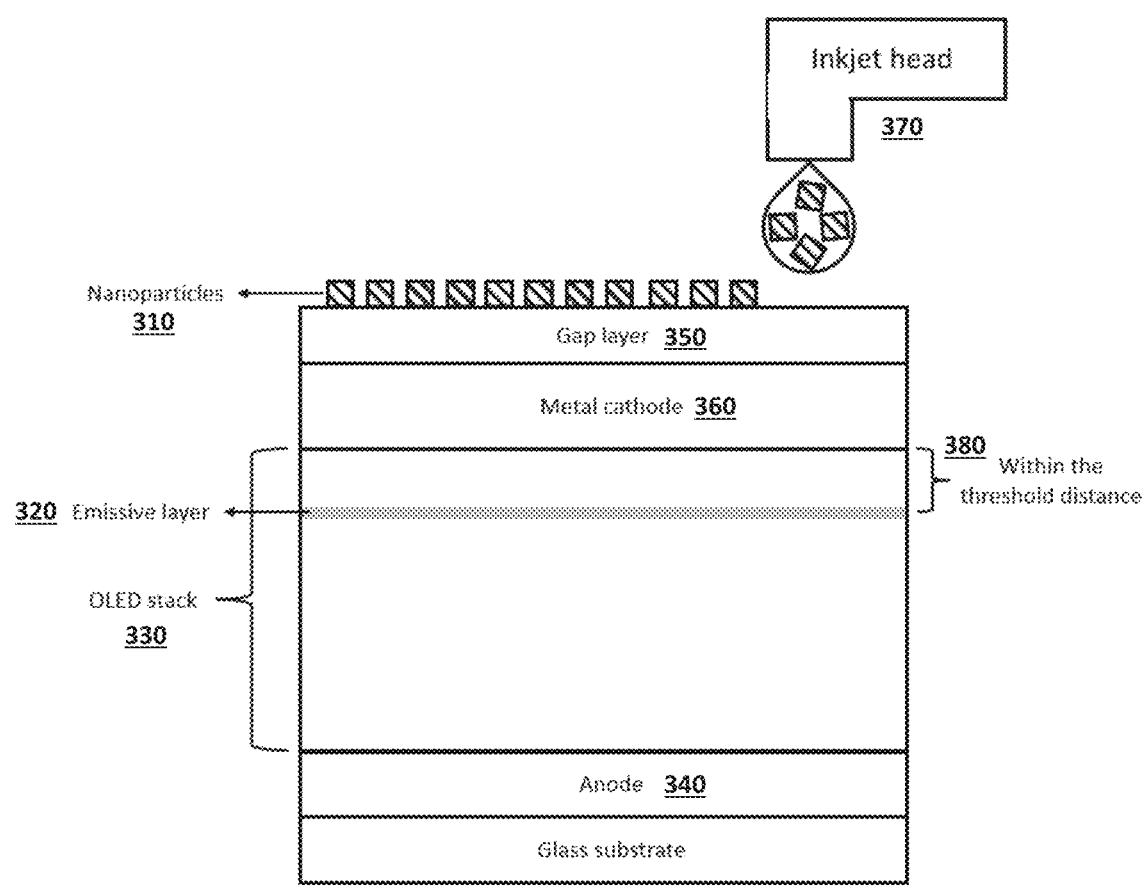
FIG. 3 shows a schematic example of a plasmonic OLED device stack along with the nanoparticle outcoupling mechanism that is formed by inkjet printing the nanoparticles atop the completed OLED according to embodiments disclosed herein.

FIG. 3 shows a schematic representation of an inkjet printing mechanism as disclosed herein, in which nanoparticles dispersed in solvent are printed atop a completed OLED. The OLED typically includes a structure as disclosed with respect to FIGS. 1-2, i.e., an OLED stack 330 including an emissive layer 320, disposed between two electrodes 360, 340. The OLED may have been fabricated using inkjet printing and/or any other suitable mechanism prior to printing the nanoparticle layer, or it may be obtained fully fabricated. In this embodiment, the OLED has an additional gap layer 350 atop the enhancement layer so that a nanopatch antenna is formed between the enhancement layer and the nanoparticles which will be formed via inkjet printing. The solvent is chosen such that it will not dissolve the organic layers or gap layer. As previously disclosed, the emissive layer 320 may be arranged within the threshold distance 380 of an enhancement layer, which may be one of the electrodes 360 of the OLED. Nanoparticles 310 dispersed in a solvent are ejected from an inkjet print head 370 toward the OLED, where they form a monolayer above the OLED structure as the solvent evaporates.

In an embodiment, the gap layer may be designed such that it acts as an encapsulant layer to shield the OLED from what may otherwise be harmful solvent exposure. The gap layer may be deposited by the inkjet printer or by any other suitable technique, including thermal evaporation, atomic layer deposition, chemical vapor deposition, sputtering, spin coating, blade coating, drop casting, or a combination thereof. Typical gap layers include, but are not limited to, organic materials (small molecule and/or polymer), oxides, nitrides, carbides, or other dielectric materials, including stacks, alloys, or mixtures of materials. In some cases, the gap material may be deposited by chemical vapor deposition, plasma enhanced chemical vapor deposition, atomic layer deposition, sputtering, vacuum thermal evaporation, or electron beam evaporation. The nanoparticles themselves may be either metal or dielectric. Typical metals used include, but are not limited to, Ag, Al, Au, Ir, Pt, Ni, Cu, W, Ta, Fe, Cr, Mg, Ga, Rh, Ti, Ru, Pd, In, Bi, Ca, and may include stacks and/or alloys of these materials, while typical dielectrics used include, but are not limited to, titania, silicon, silicon dioxide, silicon nitride, aluminum oxide, zinc oxide, nickel oxide, germanium oxide, lithium fluoride, zinc sulfide, zinc selenide, molybdenum oxide, boron nitride, indium phosphide, indium nitride, copper indium sulfide, indium phosphide, gallium arsenide, gallium sulfide, aluminum arsenide, indium arsenide, germanium, carbon, cadmium sulfide, cadmium selenide. In some embodiments, the nanoparticles are composed of mixtures of materials, layers of materials, or even alloys of materials. In some embodiments the nanoparticles may be limited to such ranges; for example, nanoparticles selected for specific applications may be limited to those having a maximum largest dimension of 1-1000 nm, more preferably 10-200 nm, or any desired sub-range within 1-1000 nm. More generally, as used herein, a "nanoparticle" refers to a particle having a largest physical dimension of 1-1000 nm, more preferably 10-200 nm, and may include related structures such as quantum dots that can absorb and/or emit light. Nanoparticles as used with embodiments disclosed herein may couple with a plasmonic device structure as previously disclosed, though such coupling is not necessary and uncoupled nanoparticles or nanoparticle monolayers may be used within the scope of the present disclosure.

An inkjet printing technique as disclosed herein may be used to pattern the nanoparticles by printing them only in select locations. This may be particularly useful, for example, in display applications where different-sized nanoparticles may be printed over different subpixels or over white subpixels while using the properties of the nanoparticle (e.g. size, shape, material, etc.) to selectively outcouple specific wavelength ranges of light, i.e. a color filter. For example, nanoparticles having different properties may be printed over different subpixels. Conversely, coating the same area with either a mixture of nanoparticle sizes/shapes/materials or multiple coats of various nanoparticle sizes/shapes/materials could be used to outcouple a broad range of wavelengths, which may be suitable to white OLED outcoupling for lighting applications. Such varied sizes/types of nanoparticles may be stored in different inkjet cartridges for ease of use/switching in high-throughput fabrication processes. A major advantage of inkjet printing nanoparticles compared to spin coating is that materials utilization is much more efficient in the case of inkjet printing, since spin coating often wastes the majority of material initially placed on the sample. More generally, one or more OLEDs may be disposed over a substrate, and nanoparticles may be deposited in a monolayer over any desired sub-group of the OLEDs. For example, nanoparticles may be deposited only over OLEDs that correspond to a particular type or color of sub-pixel in a full-color display arrangement or other multi-pixel arrangement. The nanoparticles disposed over particular types of OLEDs may have specific selected properties, such as a particular shape, size, material composition, or the like, or any desired combination thereof. For example, smaller nanoparticles have scattering resonances which are blue shifted compared to larger particles of the same material. Further, larger particle tend to have increase scattering cross-section compared to smaller particles. Ag nanoparticles for outcoupling in the visible part of the spectrum typically have sizes of about 20-200 nm.

The bulk plasmon resonance of the material also may affect the localized plasmon resonance of the particle and hence any resulting nanopatch antenna resonance. For example, Al nanoparticles have a bluer resonance than Ag nanoparticles of the same size. As another example, Au nanoparticles exhibit stronger resonance toward the red end of the visible spectrum than Ag nanoparticles of the same particle size.

Nanoparticle shape also may influence resonance. For example a 100 nm diameter Ag spherical nanoparticle will exhibit more blue resonance than a 100 nm side-length Ag cube. Shape difference may also affect the properties of the nanopatch antenna, since a sphere comes to a single point on the gap layer whereas a cube has a flat bottom, which affects electric field confinement in the gap layer and/or the effective distance from the nanoparticle to the enhancement layer. Different combinations of metals and dielectrics also may affect nanoparticle resonance.

Nanoparticles having different properties also may be deposited over a single common sub-pixel or other OLED structure. For example, it may be particularly effective to use multiple shapes, sizes, and types of nanoparticles when outcoupling a broad range of wavelengths, such as for a white or multi-color OLED structure. As another example, it may be desirable to use nanoparticles having multiple resonances in order to outcouple only specific wavelengths or wavelength ranges from a white or other broad-spectrum OLED, such as to provide a color filter or similar effect. As a specific example, Al and Ag nanoparticles may be used in combination to increase efficiency in the blue range of the visible spectrum, as noted above. As another example, a mixture of dielectric and metal nanoparticles may be used to increase the total scattering efficiency of the nanoparticle layer. In some cases, very monodisperse and well size controlled distributions may be desired as would be the case for outcoupling only a narrow band of emission.

The efficiency of the outcoupling generally increases as the nanoparticle density increases. In some cases, it is preferred that the nanoparticles do not stack, i.e. the nanoparticles are arranged in a monolayer or essentially in a monolayer, and that the particles do not come close enough to clump together. However, since aggregated particles increase the effective particle size and are therefore efficient light scatterers, in some applications nanoparticle aggregation may be desired. For example, it may be desirable to cause aggregation of nanoparticles where the aggregated nanoparticle layer is incorporated so as to act as a diffuser. In this case, the inkjet print head may be used to print multiple layers of nanoparticles over the desired region to increase the nanoparticle density. If stacking occurs, the nanoparticle area may be rinsed, for example, with the nanoparticle suspension solvent, to remove the stacked layers. Additives may also be added to the nanoparticle solution to prevent or induce aggregation during the drying process, or to effectively embed the nanoparticles in the dried additive after the solvent evaporates in order to modify the effective refractive index surrounding the nanoparticles, which will, in turn, tune the resonance of the outcoupling of the NPA.

Figure 4:
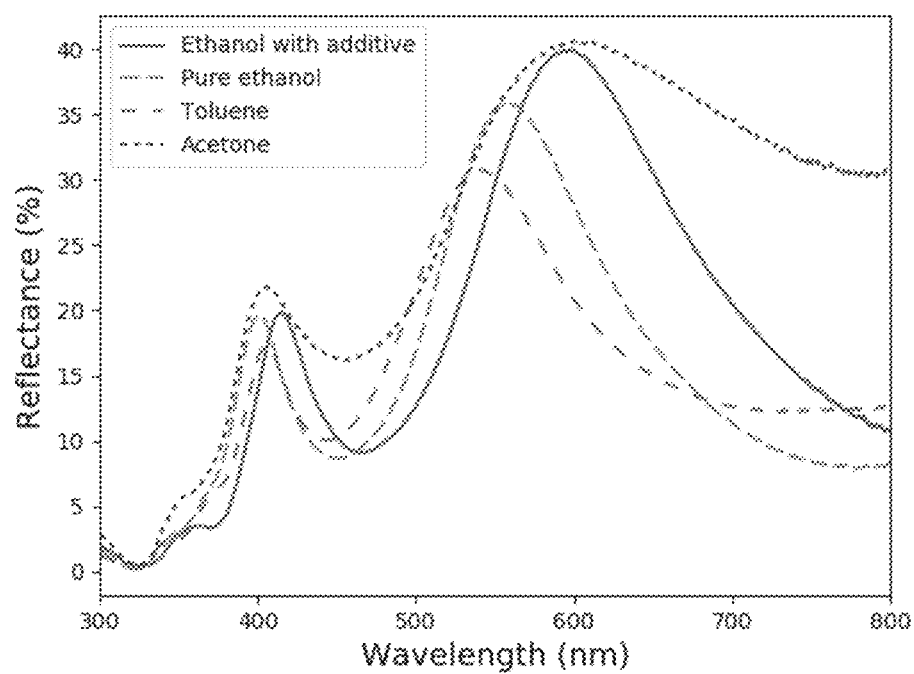
FIG. 4 show a plot of the diffuse reflectance of several nanoparticle based nanopatch antennas formed from 75 nm silver nanocubes cast from different solvents according to embodiments disclosed herein. The solvent choice affects the drying time and the antenna resonance, which is where the reflectance peak is highest.

Because the nanoparticles are effectively dropped on the surface by the inkjet head, the drying rate of the solvent influences how the nanoparticles form on the surface. This may be used to tune the NPA resonance and outcoupling efficiency, as shown in FIG. 4. FIG. 4 shows diffuse reflectance measurements of the nanopatch antenna structure, so the reflectance indicates the peak wavelength resonance of the antenna. The peak wavelength at which the antenna resonates may be tuned by modifying the nanoparticle solvent. It is believed that this phenomenon is related to the drying time of the solvents, because the speed at which the solvents dry affects the morphology of the nanoparticle film. For rapidly-drying solvents, the nanoparticles may be more likely to stack on top of each other and aggregate out of solution, resulting in a redder nanopatch antenna resonance. Typical solvents used include, in order of typical drying time, acetone (fastest), ethanol, and toluene (slowest). This phenomenon is not limited to inkjet printing, but also applicable to other nanoparticle application methods such as spin coating, blade coating, and spray coating. The effect may be tuned by using a slower- or faster-drying solvent, and/or by introducing additives into the solvent to make it dry slower or faster.

Figure 5A:
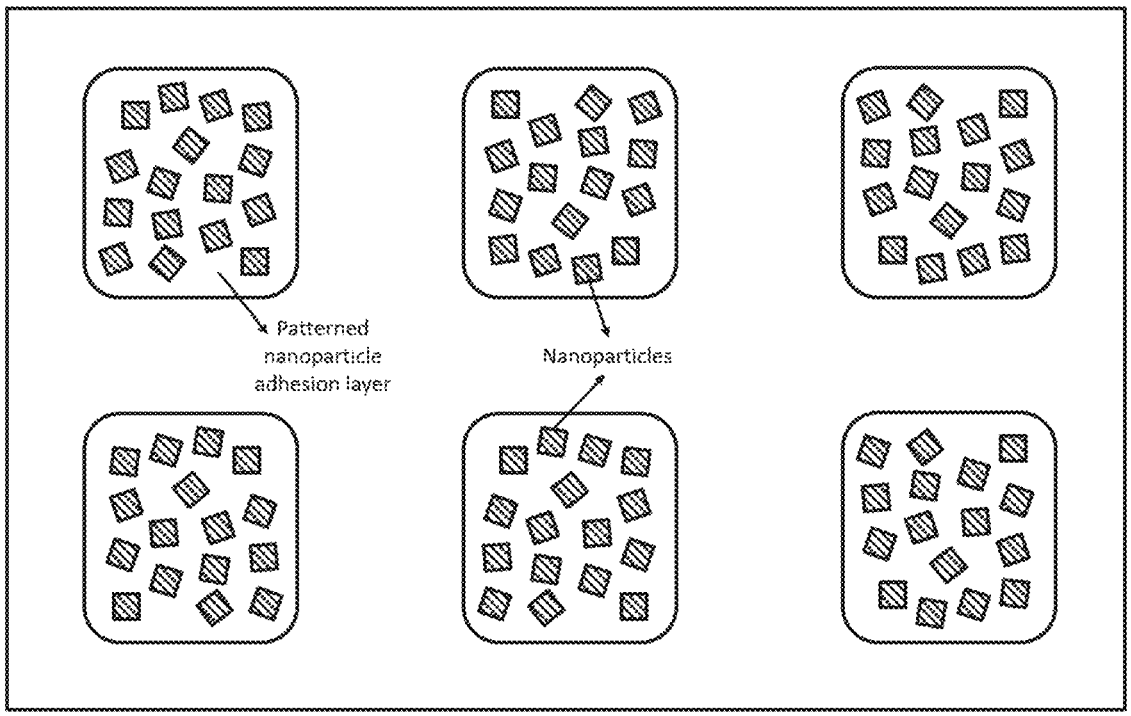
FIGS. 5A-5B show a nanoparticle film that has been patterned by an inkjet printer according to embodiments disclosed herein. Nanoparticle adhesion layers, which may or may not have been patterned by the inkjet printer, may be used to increase nanoparticle density and/or reduce aggregation.
Figure 5B:
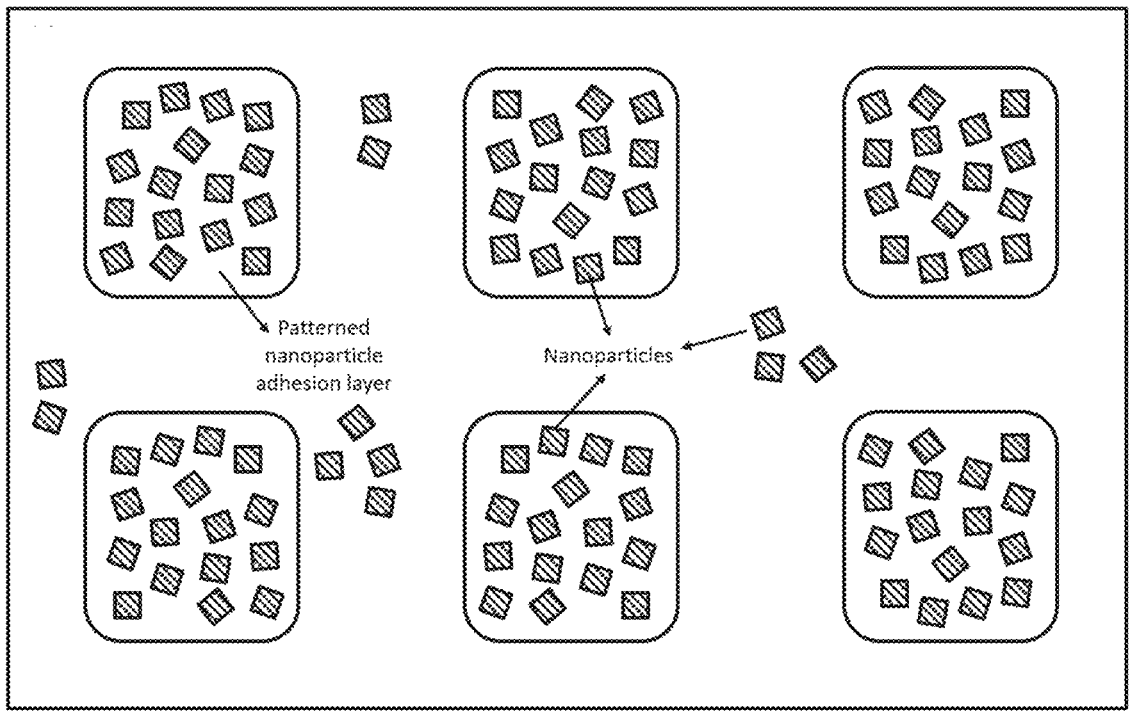

While an inkjet printer may be utilized to directly pattern the nanoparticles by printing them only in select areas, the inkjet head may conversely be used to print/pattern a nanoparticle adhesion layer and then have the nanoparticles indiscriminately deposited everywhere on the substrate, either by inkjet printing using large droplets or with overlapping passes, or by using a continuous droplet, or using another deposition technique such as spin coating or spray coating. This approach will result in areas of higher nanoparticle concentration (over top of the patterned adhesion layer) and areas of lower concentration or no nanoparticles (over non-adhesion layer areas), which may be desired for some applications such as a lighting application where a logo or diagram is intended to be brighter than the background of the light panel. To increase the density contrast between these two areas, the substrate may be rinsed to remove some nanoparticles, which reduces the nanoparticle density more aggressively in the non-adhesion layer areas. A film resulting from this process is schematically depicted in FIGS. 5A and 5B. As shown, nanoparticle adhesion layers, which may or may not have been patterned by the inkjet printer, may be used to increase nanoparticle density and/or reduce aggregation. An ideal embodiment where nanoparticles are found only on the patterned adhesion layers is depicted in FIG. 5A. FIG. 5B depicts another embodiment in which some nanoparticles are found outside the patterned adhesion layer areas. In some embodiments it is preferable for nanoparticles to be disposed only on the adhesion areas, so an arrangement as shown in FIG. 5B may be washed or rinsed to remove nanoparticles from the non-adhesion areas. In other cases it may be acceptable for the non-adhesion nanoparticles to remain, such as where they cause minimal effect in device operation due to other physical properties of the device. The adhesion layer may also be patterned via conventional lithography techniques, such as photolithography or electron beam lithography or shadow masking. Further, an adhesion layer may be used to reduce dot running as the solvent evaporates, thereby reducing aggregation in and/or the likelihood of regions where the print lines overlap due to dot or print line spreading.

Figure 6:
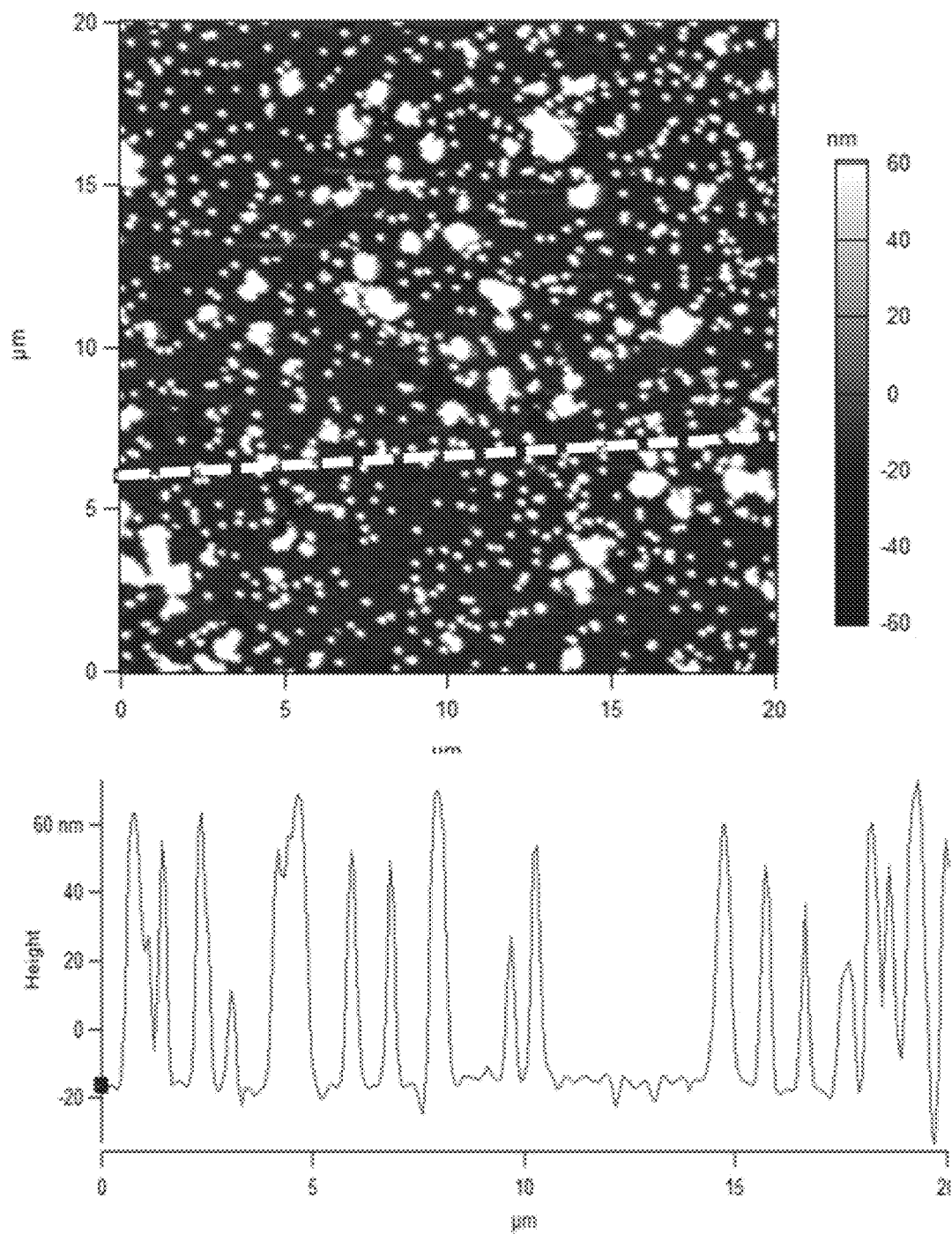
FIG. 6 shows an atomic force microscope image of an inkjet printed nanoparticle film printed in the same location three times according to embodiments disclosed herein.

FIG. 6 shows an atomic force microscope image of an inkjet-printed nanoparticle film according to embodiments disclosed herein. The film is formed of 75 nm Ag nanocubes, 8 mg/ml, printed in the same location three consecutive times on an organic thin film with no nanoparticle adhesion layer. As can be seen in the image, there is significant nanoparticle aggregation. In applications such as displays for mobile phones and the like, a monodisperse layer typically is desired. The techniques disclosed herein, such as incorporating a nanoparticle adhesion layer, selected particle concentration, variation of the solvent drying times and additives, and the like may be implemented to reduce nanoparticle aggregation.

In another embodiment, nanoparticles may be deposited using a brushing technique. For example, a paintbrush is dipped into the nanoparticle solution and brushed directly onto the device. The density of the nanoparticle film can be tuned by controlling the amount of solution absorbed by the brush, which may be a function of the brush design, such as brush size, bristle material, bristle size, bristle arial density, concentration of nanoparticles in the solution, how quickly the solvent evaporates, or how many brush strokes are made over the same area. For example, the density of the nanoparticle film can be tuned by controlling the amount of solution that gets absorbed by the brush, which may be a function of the brush design, such as brush size, bristle material, how quickly the solvent evaporates, and how many brush strokes are made over the same area. In a preferred example embodiment, a flat bristle brush with a 7 mm wide head is used to absorb 10-20 µl of 5 mg/ml 100 nm silver nanocube solution in ethanol, employing a stroke speed of approximately 50 mm per second to achieve the film. The resulting film has been found to be suitable for nanopatch antenna applications as disclosed herein. For other applications where a more dense film of nanoparticles is desired, a slower stroke speed such as 0-5 mm/s may be used (with a 0 stroke speed essentially equivalent to drop casting), and/or a nanoparticle solution with a higher concentration of nanoparticles, such as 10-15 mg/ml may be used. In general, the mass concentration of nanoparticles as disclosed herein refers to the mass of the base nanoparticle material in solution. In some embodiments, the nanoparticles also may be coated with a polymer or similar material that can affect the weight of the nanoparticles; such coatings generally are excluded from the mass concentration measurement of the nanoparticle solution. In some embodiments, the brush may be controlled by a robotic system, which may improve precision, repeatability, processing time, and the like.

In another embodiment, the nanoparticles may be spray-coated onto the device. This deposition technique employs similar tuning parameters. The nanoparticles may be sprayed using a dedicated spray coating system, some of which are commercially available, or using an airbrush system such as those commonly used for applying paint. Nanoparticle solution concentration, solvent drying rate, spraying velocity and volume, nozzle design/spray pattern, and spray head speed all contribute to the nanoparticle film morphology and density. For example, in a preferred example embodiment, a commercial airbrush compressor (manufactured by Ylingsu) is used with 5 mg/ml 100 nm silver nanocube solution in ethanol. Approximately 20-20 µl of solution is sprayed at 50 mm distance from the substrate. The working pressure of the airbrush unit is 8-9 psi, with air flow of 7-7.5 liters/min. The resulting film has been found to be suitable for nanopatch antenna applications as disclosed herein. For other applications in which a more dense film of nanoparticles may be desired, the number of passes made with the airbrush may be increased to fabricate 2-5 layers, and/or the distance from the air brush to the substrate surface may be reduced, for example to 5-10 mm.

In another embodiment, nanoparticles may be applied to the device via a transfer and lamination technique. In this technique, the nanoparticles are attached to a transferring layer, and then laminated onto the device directly or to an area where the device will subsequently be created. The nanoparticles may be deposited on the separate substrate from solution using methods such as spin casting, ink jet printing, aerosol spraying, brushing, etc., or formed on the substrate via lithography, for example, E-beam, focused ion beam, UV stepper, or any other method for patterning appropriately sized nanoparticles. Transfer layers include, but are not limited to, (a) transfer layers that pick up existing features, and (b) transfer layers that are originally attached to a substrate and then delaminated from the substrate before transfer. In some embodiments, the transferring layer is subsequently removed, leaving the nanoparticles behind on the device; in other embodiments, the transfer layer remains attached to the nanoparticles even after being attached to the device. In this latter embodiment, it may be preferable that the transferring layer be transparent across the visible spectrum, or it may be preferable that the transferring layer have a narrower transparency window to act as a color filter; the transferring layer may also be clear, hazy, or engineered specifically to control the emission profile of the device. In one example embodiment, the transferring layer is a transparent tape; in another embodiment, the transferring layer is a thin polymer layer in which nanoparticles are embedded. In a preferred embodiment when the transfer layer will not be removed from the nanoparticles and becomes part of the device active area, the transfer layer should be thin to reduce waveguiding.

Figure 9A:
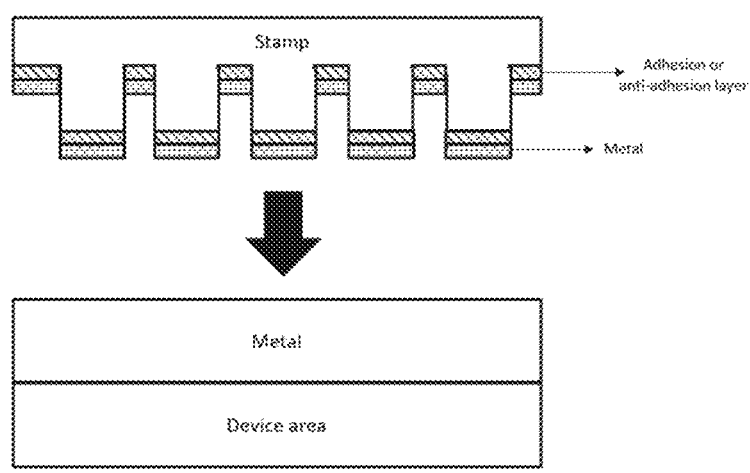
FIGS. 9A, 9B, and 9C sequentially depict a cold-welding process to stamp nanoparticle features onto a device according to embodiments disclosed herein.
Figure 9B:
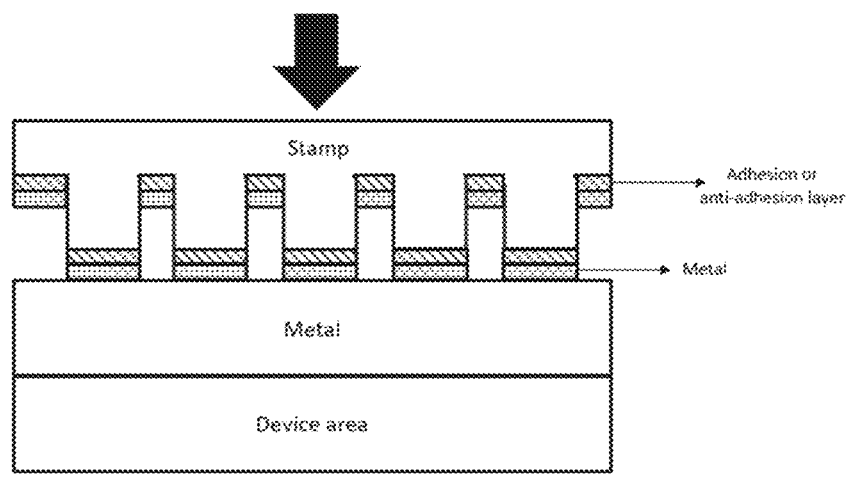
Figure 9C:
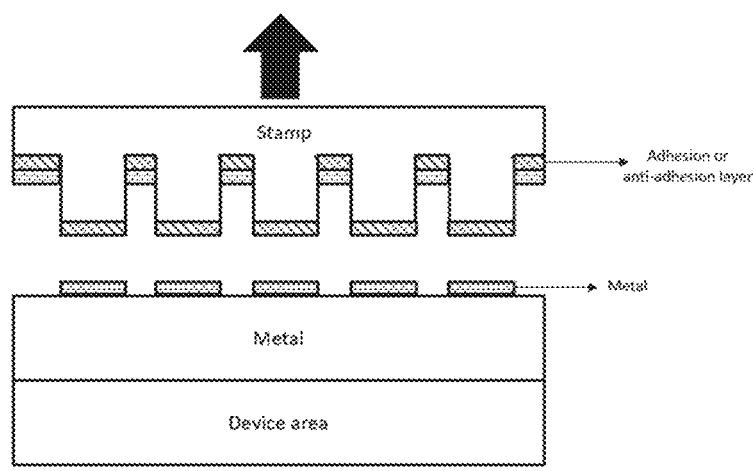

In another embodiment, nanoparticles may be applied to the device via low pressure cold welding. In this method, a stamp is obtained with the desired nanoparticle pattern etched into the stamp surface. In some cases, the stamp pattern may be the inverse tonality of the final desired nanoparticle pattern. The stamp may be either elastomeric or rigid. In one example embodiment, the stamp may or may not be coated with a first layer followed by a second layer consisting of metal. One embodiment involves transferring the metal layer from the stamp to the device by cold welding. This is achieved by pressing the stamp onto the device area such that the metal layer over the patterned stamp contacts portions of the device area and applying pressure until cold welding of the metal layer to the device area is achieved, as shown in FIGS. 9A-9C, sequentially. The stamp is then removed and the cold-welded portions of the metal layer from the stamp remain behind on the device area in substantially the same pattern as the patterned stamp as shown in FIG. 9C. In this embodiment, it may be preferred to have the stamp's first layer be a metal anti-adhesion layer that causes the metal layer to preferentially stick to the device area than the stamp itself.

Figure 10A:
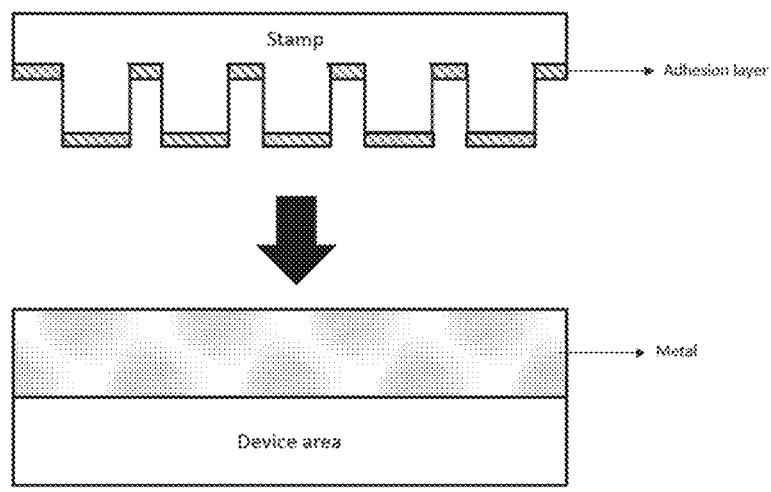
FIGS. 10A, 10B, and 10C sequentially depict a cold-welding stamp process in combination with a device structure according to embodiments disclosed herein.
Figure 10B:
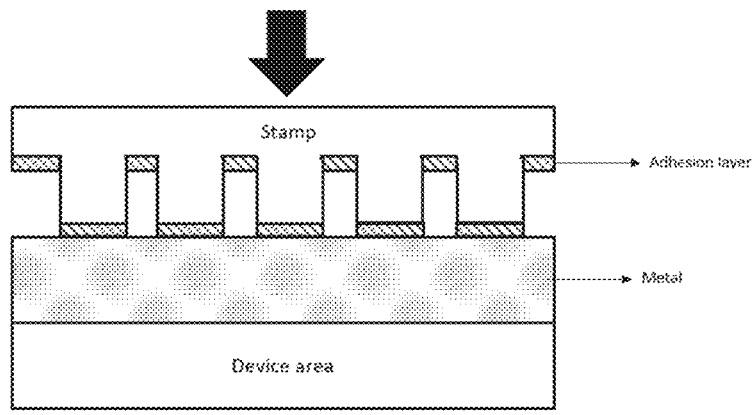
Figure 10C:
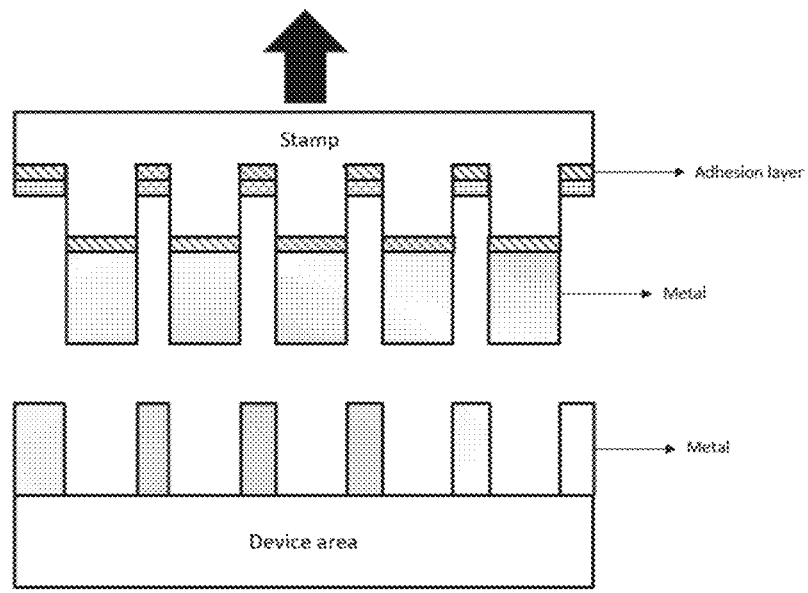

In another embodiment, the patterned stamp may or may not be coated with a first layer followed by a second layer consisting of metal. In this embodiment, the patterned stamp is used to pattern a continuous metal film already present on the device area, as shown in FIGS. 10A-10C sequentially. Here, the patterned stamp is pressed onto the continuous metal film located on the device area and sufficient pressure is applied to compress the underlying layers on the device area. This will deform the device area layers, thereby breaking the continuous metal film on the device area at the juncture between the raised and depressed portions of the stamp. The now-broken metal pieces on the device area will be cold-welded to the metal layer on the stamp and will be removed after the stamp is lifted off the device area, as shown in FIG. 10C. In this embodiment, it may be preferred to have the stamp's first layer be a metal adhesion layer that causes the metal layer to preferentially stick to the stamp rather than the layer on the device area.

Figure 11A:
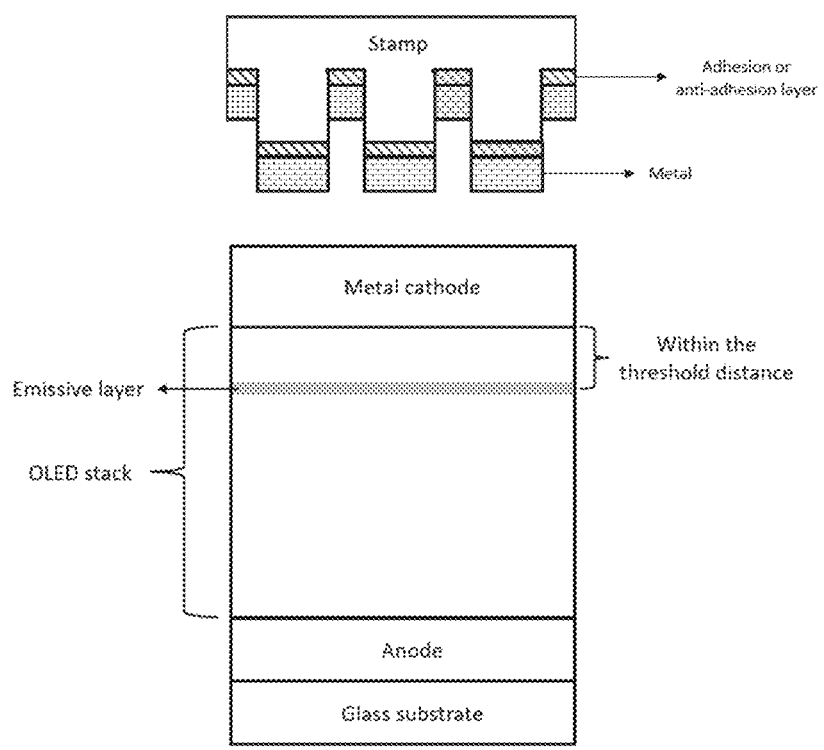
FIGS. 11A, 11B, and 11C sequentially depict a cold-welding stamp process in combination with a device structure according to embodiments disclosed herein.
Figure 11B:
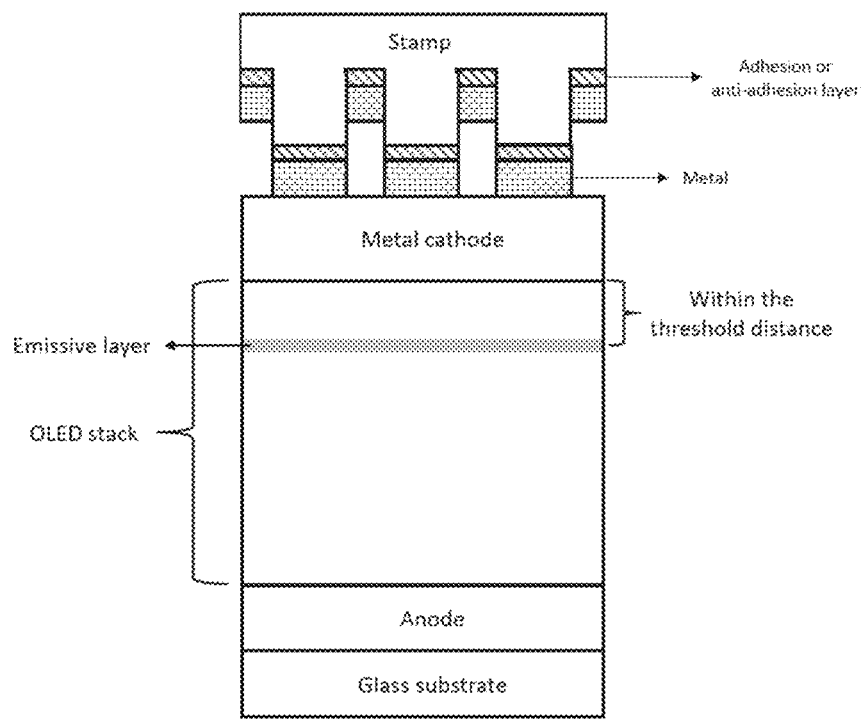
Figure 11C:
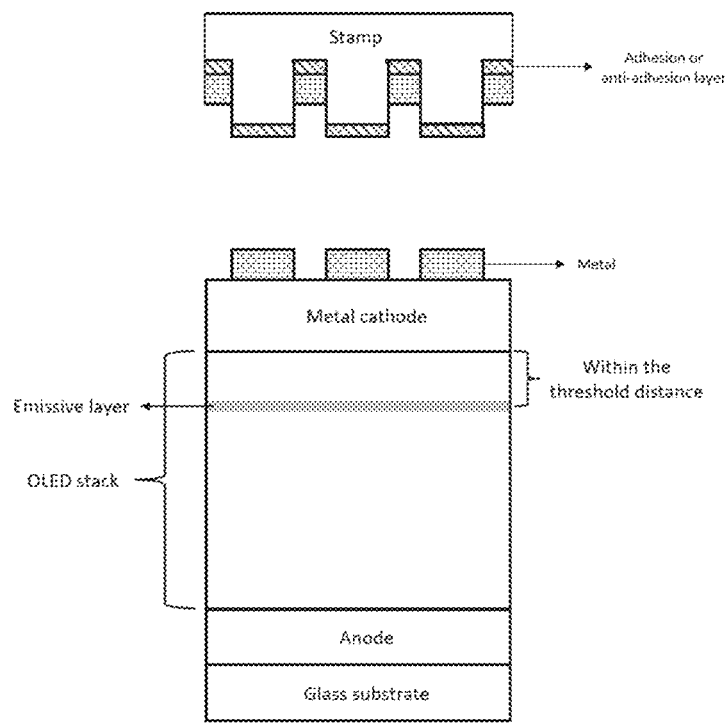
Figure 12A:
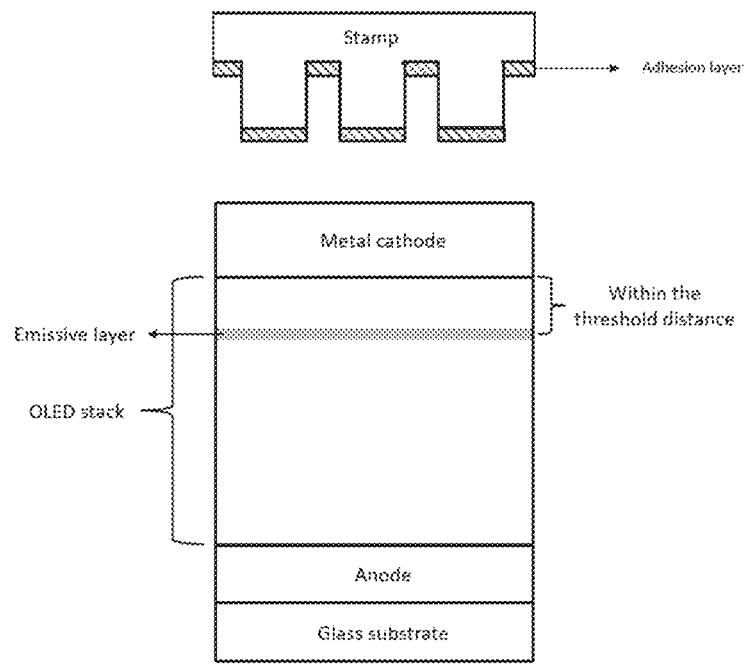
FIGS. 12A, 12B, and 12C sequentially depict a cold-welding stamp process in combination with a device structure according to embodiments disclosed herein.
Figure 12B:
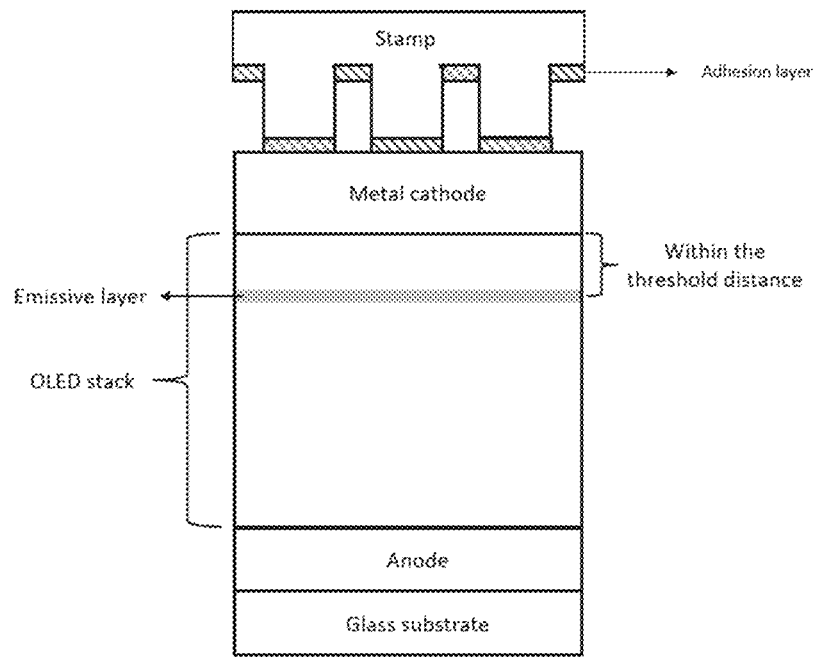
Figure 12C:
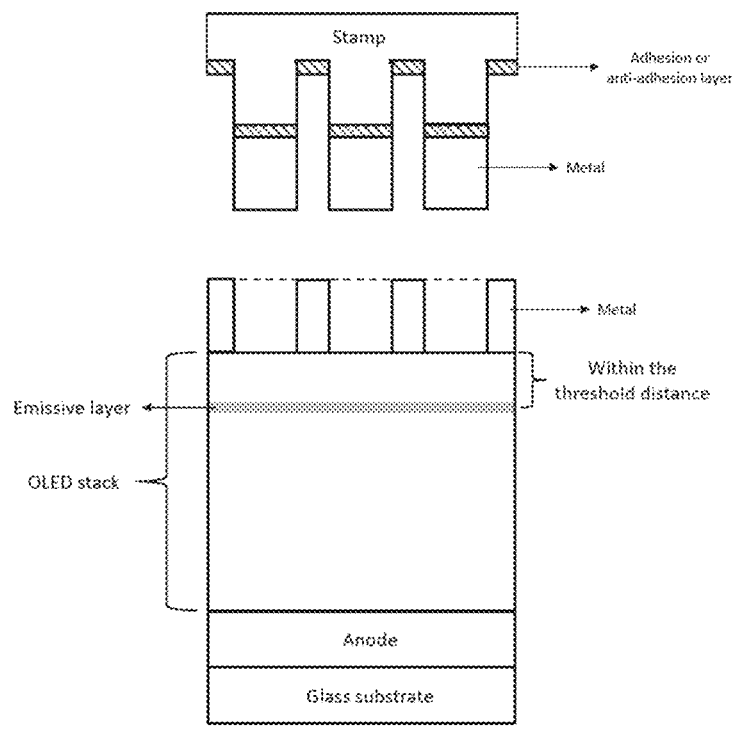

In another embodiment shown in FIGS. 11A-11C sequentially, the cold-welding stamp process is additive to create a metal enhancement layer (here, a cathode) with a planar bottom side and a corrugated top side to enable outcoupling from the plasmon mode. In a similar embodiment shown in FIGS. 12A-12C sequentially, the cold-welding stamp process is subtractive to remove material from the enhancement layer (here, a cathode) in order to pattern the enhancement layer into a desired structure. In an example embodiment, one such structure may be a nanohole array or through-hole array that preserves the continuity of the cathode layer so it can still inject charge into the OLED.

Figure 13A:
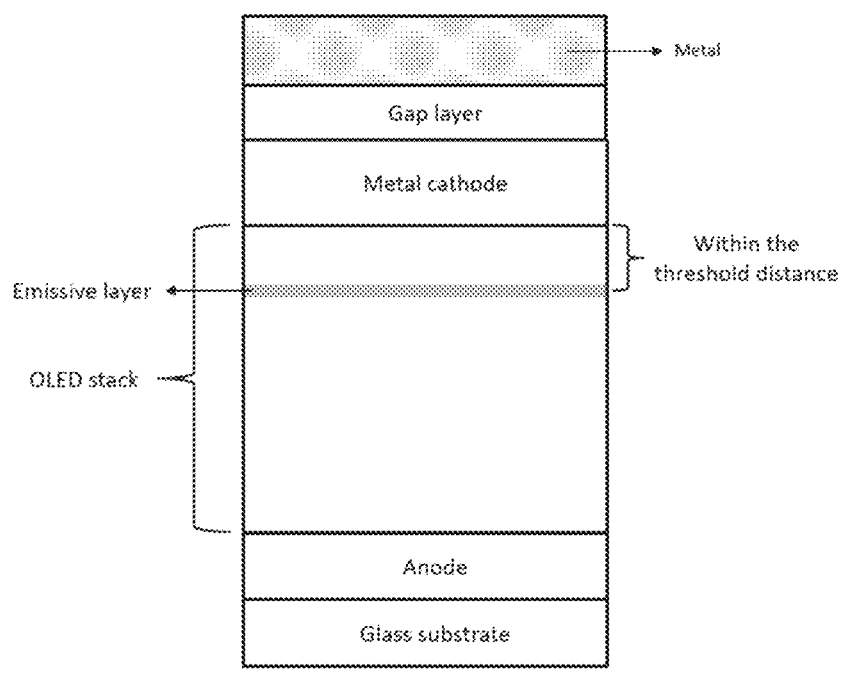
FIGS. 13A, 13B, and 13C sequentially depict a cold-welding stamp process in combination with a device structure according to embodiments disclosed herein.
Figure 13B:
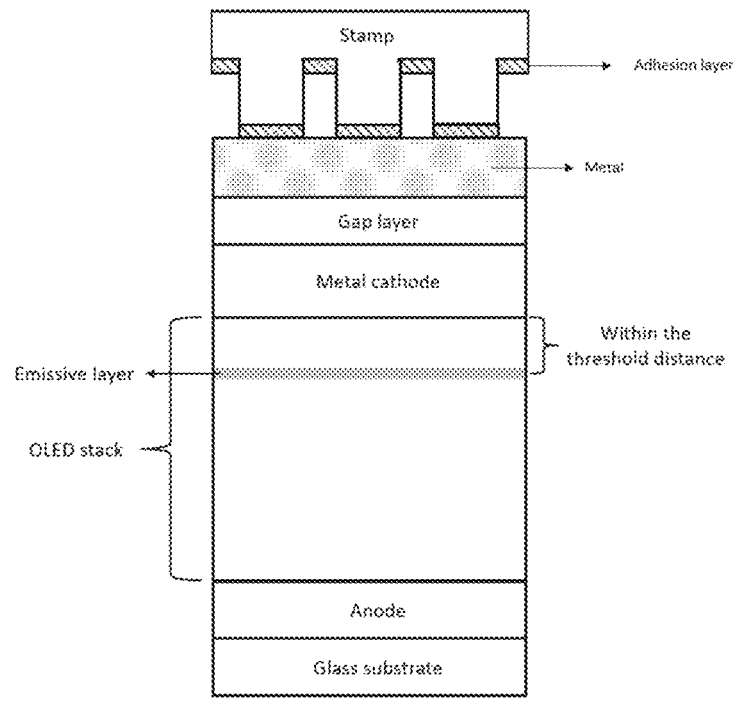
Figure 13C:
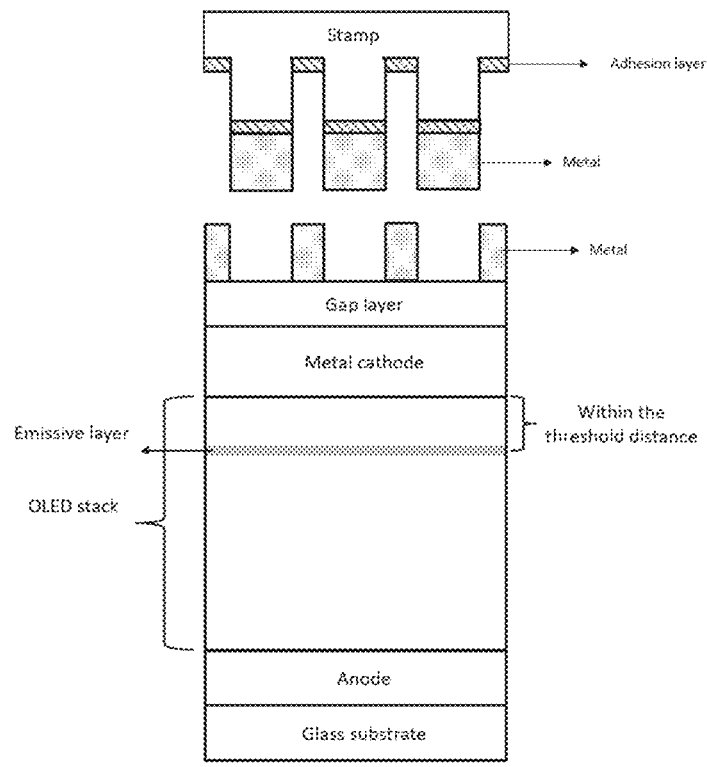

In another embodiment shown in FIGS. 13A-13C sequentially, the cold-welding stamp process is again subtractive to achieve a desired nanopatterned structure on top of a gap layer. Such nanopatterned structures may include, but are not limited to, a nanohole or through-hole array, or a nanoparticle array. The nanopatterned structure atop the gap layer establishes a means by which to outcouple the plasmon energy stored in the enhancement layer as light. In this and the previously-disclosed embodiments, the EML is located within a threshold distance of the enhancement layer as previously disclosed herein.

Nanoparticles, nanoparticle monolayers, and resulting structures such as nanopatch antennas as disclosed herein may be used in conjunction with any OLED structure, including those disclosed with respect to FIGS. 1 and 2. The OLEDs may include any desired components and structures, including color-altering layers such as color filters, up- and/or down-conversion layers, cavity structures, outcoupling components, and the like.

Experimental

Figure 7A:
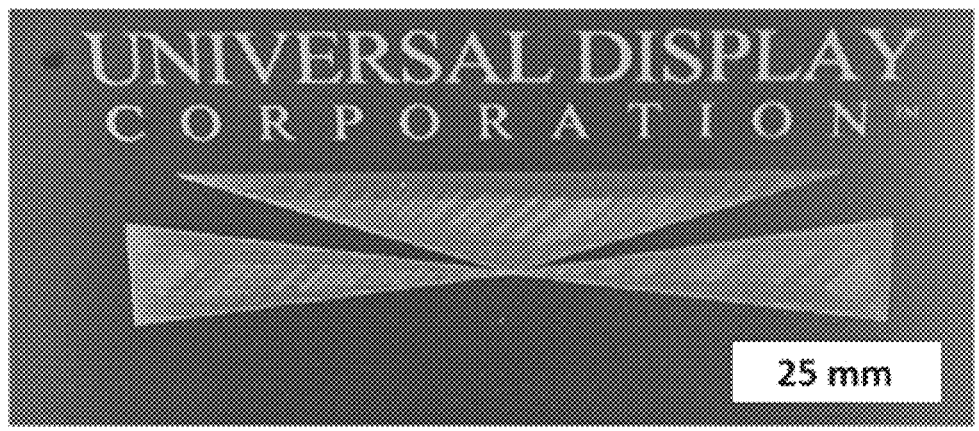
FIG. 7A shows a photograph of silver nanocubes inkjet printed into the logo of Universal Display Corp. according to embodiments disclosed herein.
Figure 7B:
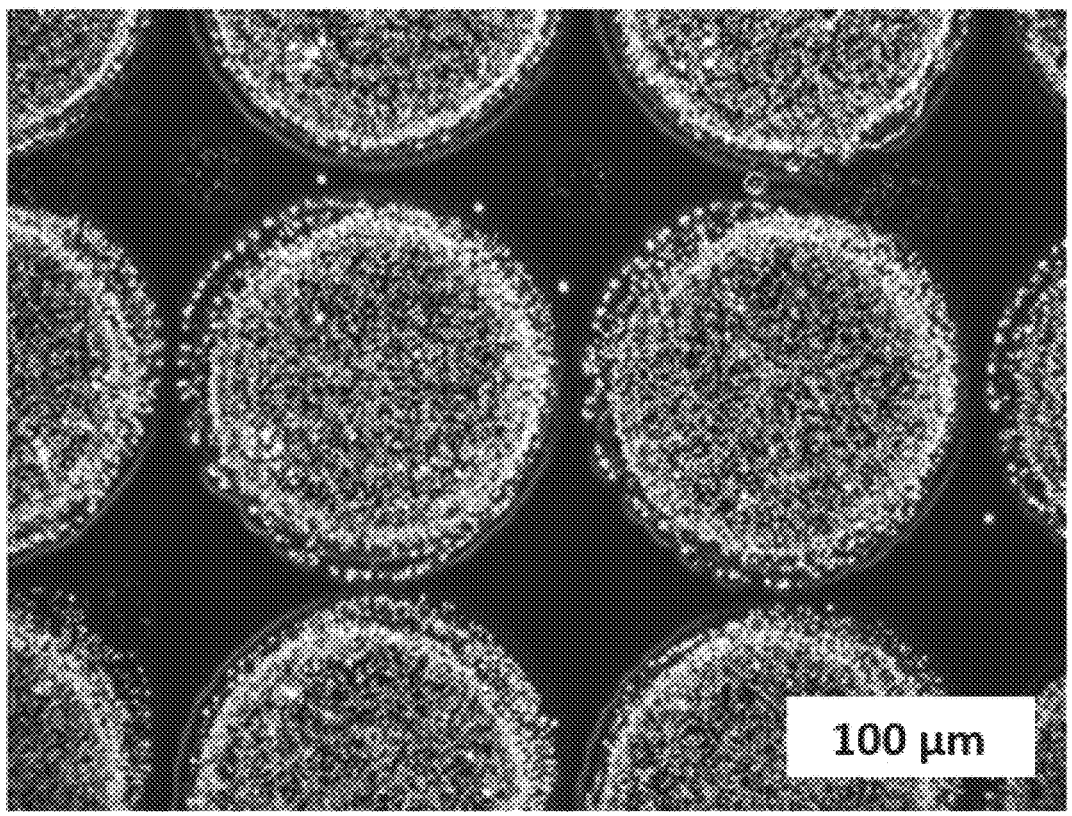
FIG. 7B shows a darkfield microscope image of the silver nanocubes deposited via inkjet printing according to embodiments disclosed herein.

A photograph of an example nanoparticle film, pattered via inkjet printing, is shown in FIG. 7A, with a zoomed-in version of the film in a darkfield microscope image displayed in FIG. 7B. As shown in FIG. 7B, the printed droplets are well-defined and don't bleed together to form a continuous film. This can be achieved by using the parameters disclosed herein, such as drop size, solvent composition, the use of a heated platen, and the like. If, for example too big of a droplet size is used, the droplets will necessarily run together, but in this image, the nanoparticles are isolated to specific regions without running together.

OLEDs were grown on a glass substrate pre-coated with an indium-tin-oxide (ITO) layer having a sheet resistance of 15-Ω/sq. Prior to any organic layer deposition or coating, the substrate was degreased with solvents and then treated with an oxygen plasma for 1.5 minutes with 50 W at 100 mTorr and with UV ozone for 5 minutes.

Figure 8:
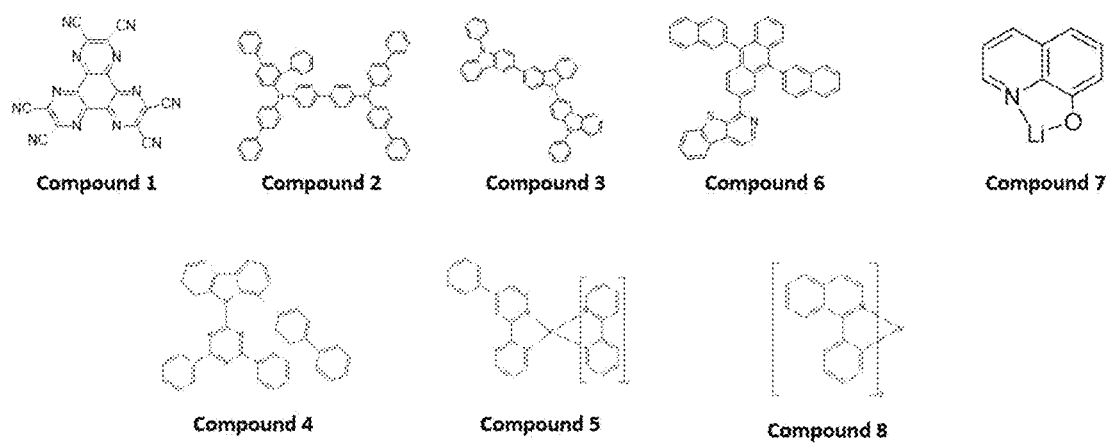
FIG. 8 shows chemical structures of the molecules used in the devices of Table 1.

Devices were fabricated in high vacuum (<10-6 Torr) by thermal evaporation. The anode electrode was 750 Å of indium tin oxide (ITO). From the ITO surface, each device had the following structure of organic layers, with materials referenced using the names shown in FIG. 8 and resulting EQE values are shown in Table 1:

Device A: 100 Å thick Compound 1 (HIL), 350 Å layer of Compound 2 (HTL), 50 Å of Compound 3 (EBL), 50 Å of Compound 4 doped with 18% Compound 5 and doped with 3% of Compound 8 (EML), 50 Å of Compound 4 (BL), 100 Å of Compound 7 doped with 35% of Compound 6 (En), 10 Å of Compound 7 (EIL), 15 Å of Ca followed by 340 Å of Ag (Cath), 400 Å of Compound 2 (gap layer), and topped with either spin cast 100 nm Ag nanocubes in 3 mg/ml concentration solution or inkjet-printed 75 nm Ag nanocubes in 4 mg/ml concentration solution.

Device B: 100 Å thick Compound 1 (HIL), 350 Å layer of Compound 2 (HTL), 50 Å of Compound 3 (EBL), 50 Å of Compound 4 doped with 18% Compound 5 and doped with 3% of Compound 8 (EML), 20 Å of Compound 4 (BL), 170 Å of Compound 7 doped with 35% of Compound 6 (En), 10 Å of Compound 7 (EIL), 15 Å of Ca followed by 340 Å of Ag (Cath), 400 Å of Compound 2 (gap layer), and topped with either spin cast 100 nm Ag nanocubes in 7 mg/ml concentration solution or airbrush-applied 100 nm Ag nanocubes in 5 mg/ml concentration solution.

Device C: 100 Å thick Compound 1 (HIL), 350 Å layer of Compound 2 (HTL), 50 Å of Compound 3 (EBL), 50 Å of Compound 4 doped with 18% Compound 5 and doped with 3% of Compound 8 (EML), 20 Å of Compound 4 (BL), 150 Å of Compound 7 doped with 35% of Compound 6 (En), 10 Å of Compound 7 (EIL), 15 Å of Ca followed by 340 Å of Ag (Cath), 400 Å of Compound 2 (gap layer), and topped with either spin cast 100 nm Ag nanocubes in 7 mg/ml concentration solution or two strokes of paint brush-applied 100 nm Ag nanocubes in 5 mg/ml concentration solution.

All devices were encapsulated with a glass lid sealed with an epoxy resin in a nitrogen glove box (<1 ppm of $H_2O$ and $O_2$) immediately after fabrication with a moisture getter incorporated inside the package. Doping percentages are in volume percent.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A method comprising:
    obtaining a substrate having an organic light emitting diode (OLED) disposed thereon, the OLED comprising:
        an emissive layer comprising an organic emissive material, wherein the organic emissive material has a total non-radiative decay rate constant $k_{non-rad}^0$, a total radiative decay rate constant $k_{rad}^0$, a total non-radiative decay rate constant due to the enhancement layer $k_{non-rad}^{plasmon}$, and a total radiative decay rate constant due to the enhancement layer $k_{rad}^{plasmon}$;
        an enhancement layer disposed within a threshold distance of the emissive layer at which $$\frac{k_{rad}^{plasmon}}{k_{non-rad}^{plasmon}} = \frac{k_{rad}^0}{k_{non-rad}^0}; \text{ and}$$

a gap layer disposed over the enhancement layer; and
    inkjet printing nanoparticles over the gap layer by ejecting the nanoparticles dispersed in a solvent from an inkjet printhead toward the OLED to form a monolayer of nanoparticles over the gap layer;
    wherein the nanoparticles are dispersed in the solvent at a mass density of 1-10 mg/mL.

2. The method of claim 1, wherein a ratio of drop size to distance between adjacent drops on the OLED is 1:1 to 3:1.

3. The method of claim 1, wherein the drops are ejected from the inkjet printhead at a rate of 100-2000 drops per second.

4. The method of claim 1, further comprising moving the inkjet printhead across the surface of the OLED at a speed of 10-100 mm/s.

5. The method of claim 1, further comprising maintaining a platen on which the substrate is disposed during the step of inkjet printing the nanoparticles at a temperature of 20-100 C.

6. The method of claim 1, wherein the solvent comprises a plurality of solvents.

7. The method of claim 1, further comprising forming the gap layer over the top cathode prior to ejecting the nanoparticles toward the OLED.

8. The method of claim 7, wherein the gap layer is deposited via inkjet printing.

9. The method of claim 7, wherein the gap layer is deposited via thermal evaporation, atomic layer deposition, chemical vapor deposition, sputtering, spin coating, blade coating, drop casting, or a combination thereof.

10. The method of claim 1, wherein the nanoparticles comprise Ag, Al, Au, Ir, Pt, Ni, Cu, W, Ta, Fe, Cr, Mg, Ga, Rh, Ti, Ru, Pd, In, Bi, Ca, or a combination thereof.

11. The method of claim 1, wherein the nanoparticles comprise titania, silicon, silicon dioxide, silicon nitride, aluminum oxide, zinc oxide, nickel oxide, germanium oxide, lithium fluoride, zinc sulfide, zinc selenide, molybdenum oxide, or a combination thereof.

12. The method of claim 1, wherein a plurality of OLEDs are disposed over the substrate and the method further comprises depositing nanoparticles only over selected OLEDs of the plurality of OLEDs.

13. The method of claim 12, wherein the selected OLEDs correspond to a type of sub-pixel in a multi-pixel display.

14. The method of claim 1, wherein the nanoparticles have a variety of shapes, sizes, and/or materials.

15. The method of claim 14, wherein at least one of the shape, size, or material is selected based upon a type of sub-pixel over which the nanoparticles are deposited.

16. The method of claim 1, further comprising:
    depositing a patterned nanoparticle adhesion layer over the OLED prior to inkjet printing the nanoparticles.

17. The method of claim 1, further comprising:
    filtering material ejected by the inkjet printhead as the material is ejected by the inkjet printhead to remove unwanted material, to reduce nanoparticle aggregation within the solvent, or a combination thereof.

18. A consumer electronic device fabricated according to the method of claim 1.

19. The consumer electronic device of claim 18, wherein the device is at least one type selected from the group consisting of: a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, and a sign.

20. A method comprising:

obtaining a substrate having an organic light emitting diode (OLED) disposed thereon, the OLED comprising:

an emissive layer comprising an organic emissive material, wherein the organic emissive material has a total non-radiative decay rate constant $k_{non-rad}^{0}$, a total radiative decay rate constant $k_{rad}^{0}$, a total non-radiative decay rate constant due to the enhancement layer $k_{non-rad}^{plasmon}$, and a total radiative decay rate constant due to the enhancement layer $k_{rad}^{plasmon}$;

an enhancement layer disposed within a threshold distance of the emissive layer at which $$\frac{k_{rad}^{plasmon}}{k_{non-rad}^{plasmon}} = \frac{k_{rad}^{0}}{k_{non-rad}^{0}}; \text{ and}$$

a gap layer disposed over the enhancement layer;

inkjet printing nanoparticles over the gap layer by ejecting the nanoparticles dispersed in a solvent from an inkjet printhead toward the OLED to form a monolayer of nanoparticles over the gap layer; and moving the inkjet printhead across the surface of the OLED at a speed of 10-100 mm/s;

wherein a ratio of drop size to distance between adjacent drops on the OLED is 1:1 to 3:1; and wherein the drops are ejected from the inkjet printhead at a rate of 100-2000 drops per second.

* * * * *